US012117346B2

(12) United States Patent
Sundara Moorthy et al.

(10) Patent No.: US 12,117,346 B2
(45) Date of Patent: Oct. 15, 2024

(54) STARTUP PROCEDURE FOR A PASSIVE INFRARED SENSING CIRCUIT

(71) Applicant: Lutron Technology Company LLC, Coopersburg, PA (US)

(72) Inventors: Dinesh Sundara Moorthy, Allentown, PA (US); James P. Steiner, Royersford, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 221 days.

(21) Appl. No.: 17/738,322

(22) Filed: May 6, 2022

(65) Prior Publication Data

US 2022/0381618 A1    Dec. 1, 2022

Related U.S. Application Data

(60) Provisional application No. 63/194,229, filed on May 28, 2021.

(51) Int. Cl.
*H03F 3/08*    (2006.01)
*G01J 5/34*    (2022.01)
*H01H 3/02*    (2006.01)
*H05B 47/13*   (2020.01)

(52) U.S. Cl.
CPC .............. *G01J 5/34* (2013.01); *H01H 3/0213* (2013.01); *H03F 3/087* (2013.01); *H05B 47/13* (2020.01)

(58) Field of Classification Search
CPC ......... G08B 13/19; G08B 13/191; H03F 3/70; H03F 3/00; H03F 3/082; H03F 3/087; H03F 3/42; H03F 3/10; H03F 3/14; H03F 3/347; H03F 5/00; H03F 5/2203; H03F 5/45528; G01J 5/34
See application file for complete search history.

(56) References Cited

U.S. PATENT DOCUMENTS

| 7,940,167 | B2 | 5/2011 | Steiner et al. |
| 8,514,075 | B1 | 8/2013 | Steiner |
| 9,955,547 | B2 | 4/2018 | Taipale et al. |
| 10,314,129 | B2 | 6/2019 | Kober et al. |

FOREIGN PATENT DOCUMENTS

DE    19913655 A1 *  5/2000  ............. H03F 3/087

* cited by examiner

*Primary Examiner* — Don K Wong
(74) *Attorney, Agent, or Firm* — Philip N. Smith; Glen R. Farbanish; Michael S. Czarnecki

(57) ABSTRACT

A control device may comprise a passive infrared sensing circuit configured to operate in a charging state to charge one or more capacitors to appropriate voltages for operation in an operational state of the sensing circuit. The sensing circuit may comprise a pyroelectric detector configured to generate an output signal in response to received infrared energy, and first and second amplifier circuits configured to amplify the output signal. The control device may comprise a control circuit coupled to receive a sensing signal from the second amplifier circuit. Prior to the operational state, a capacitor of the first amplifier circuit may charge through a diode coupled between an output and an inverting input of an operational amplifier. In addition, prior to the operational state, a capacitor of the passive infrared sensing circuit may charge through the control circuit until the magnitude of a voltage across the capacitor exceeds a threshold voltage.

23 Claims, 6 Drawing Sheets

STARTUP PROCEDURE FOR A PASSIVE INFRARED SENSING CIRCUIT

CROSS-REFERENCE TO RELATED APPLICATIONS

This application claims the benefit of U.S. Provisional Patent Application No. 63/194,229, filed on May 28, 2021, the entire disclosure of which is hereby incorporated by reference.

BACKGROUND

Occupancy and vacancy sensors are often used to detect occupancy and/or vacancy conditions in a space in order to control an electrical load, such as, for example, a lighting load. An occupancy sensor may typically operate to turn on the lighting load when the occupancy sensor detects the presence of a user in the space (e.g., an occupancy condition and/or event) and then to turn off the lighting load when the occupancy sensor detects that the user has left the space (e.g., a vacancy condition and/or event). A vacancy sensor may only operate to turn off the lighting load when the vacancy sensor detects a vacancy condition in the space (e.g., the vacancy sensor may not turn on the lighting load in response to an occupancy condition). Therefore, when using a vacancy sensor, the lighting load must be turned on manually (e.g., in response to a manual actuation of a control actuator). Occupancy and vacancy sensors have often been provided in wall-mounted load control devices that are coupled between an alternating-current (AC) power source and an electrical load for control of the amount of power delivered to the electrical load. Such wall-mounted load control devices may comprise internal detectors, such as, for example, a pyroelectric detector, and a lens for directing energy to the pyroelectric detector for detecting the presence and/or absence of the user in the space.

SUMMARY

As described herein, a control device may comprise a passive infrared sensing circuit configured to operate in a charging state to charge one or more capacitors to appropriate voltages for operating in an operational state of the passive infrared sensing circuit. The passive infrared sensing circuit may comprise a pyroelectric detector configured to receive infrared energy and generate an output signal in response to the received infrared energy. The pyroelectric detector may generate the output signal as an alternating-current signal having a direct-current offset during an operational state of the passive infrared sensing circuit. The passive infrared sensing circuit may further comprise a first amplifier circuit configured to amplify the output signal of the pyroelectric detector to generate an amplified signal, and a second amplifier circuit configured to receive the amplified signal. The control device may also comprise a control circuit coupled to receive a passive infrared sensing signal from the second amplifier circuit of the passive infrared sensing circuit.

The first amplifier circuit may comprise an operational amplifier having an inverting input, a non-inverting input, and an output. The operational amplifier of the first amplifier circuit may receive power from a supply voltage that is referenced to a circuit common. The non-inverting input of the operational amplifier of the first amplifier circuit may be coupled to receive the output signal of the pyroelectric detector. The first amplifier circuit may further comprise a series combination of a first resistor and a first capacitor coupled between the inverting input of the operational amplifier and the circuit common, a parallel combination of a second resistor and a second capacitor coupled between the inverting input and the output of the operational amplifier, and a diode having an anode coupled to the output of the operational amplifier and a cathode coupled to the inverting input of the operational amplifier. Prior to the passive infrared sensing circuit entering an operational state, the operational amplifier is configured to drive a voltage at the output high towards the supply voltage and the diode is configured to conduct at least a portion of a charging current from the supply voltage to charge the first capacitor. The first capacitor may be configured to charge to a voltage approximately equal to the direct-current offset of the output signal of the pyroelectric detector.

In addition, the control circuit may be configured to charge a capacitor of the passive infrared detection circuit through the control circuit (e.g., through a port of a processor or other digital processing device) prior to entering the operational state. For example, the passive infrared sensing circuit may comprise a reference voltage circuit configured to generate a reference voltage. The reference voltage circuit may comprise a capacitor across which the reference voltage is developed. The reference voltage circuit may be configured to couple the reference voltage to the amplified signal received by the second amplifier circuit, such that the amplified signal has a direct-current offset equal to approximately the magnitude of the reference voltage. Prior to the passive infrared sensing circuit entering the operational state, the control circuit may be configured to charge the capacitor of the reference voltage circuit by conducting a charging current through the control circuit and the capacitor of the reference voltage circuit, and stop charging the capacitor when the magnitude of a voltage developed across the capacitor is greater than or equal to a threshold voltage.

Further, the second amplifier circuit may comprise an operational amplifier having an inverting input, a non-inverting input, and an output. The non-inverting input of the operational amplifier of the second amplifier circuit may be coupled to receive the amplified signal. The second amplifier circuit may further comprise a series combination of a first resistor and a first capacitor coupled between the inverting input of the operational amplifier and the circuit common, and a parallel combination of a second resistor and a second capacitor coupled between the inverting input and the output of the operational amplifier. Prior to the passive infrared sensing circuit entering the operational state, the control circuit is configured to charge the first capacitor of the second amplifier circuit by conducting a charging current through the control circuit and the first capacitor, and stop charging the first capacitor when the magnitude of a voltage developed across the first capacitor is greater than or equal to a threshold voltage.

DETAILED DESCRIPTION

Figure 1:
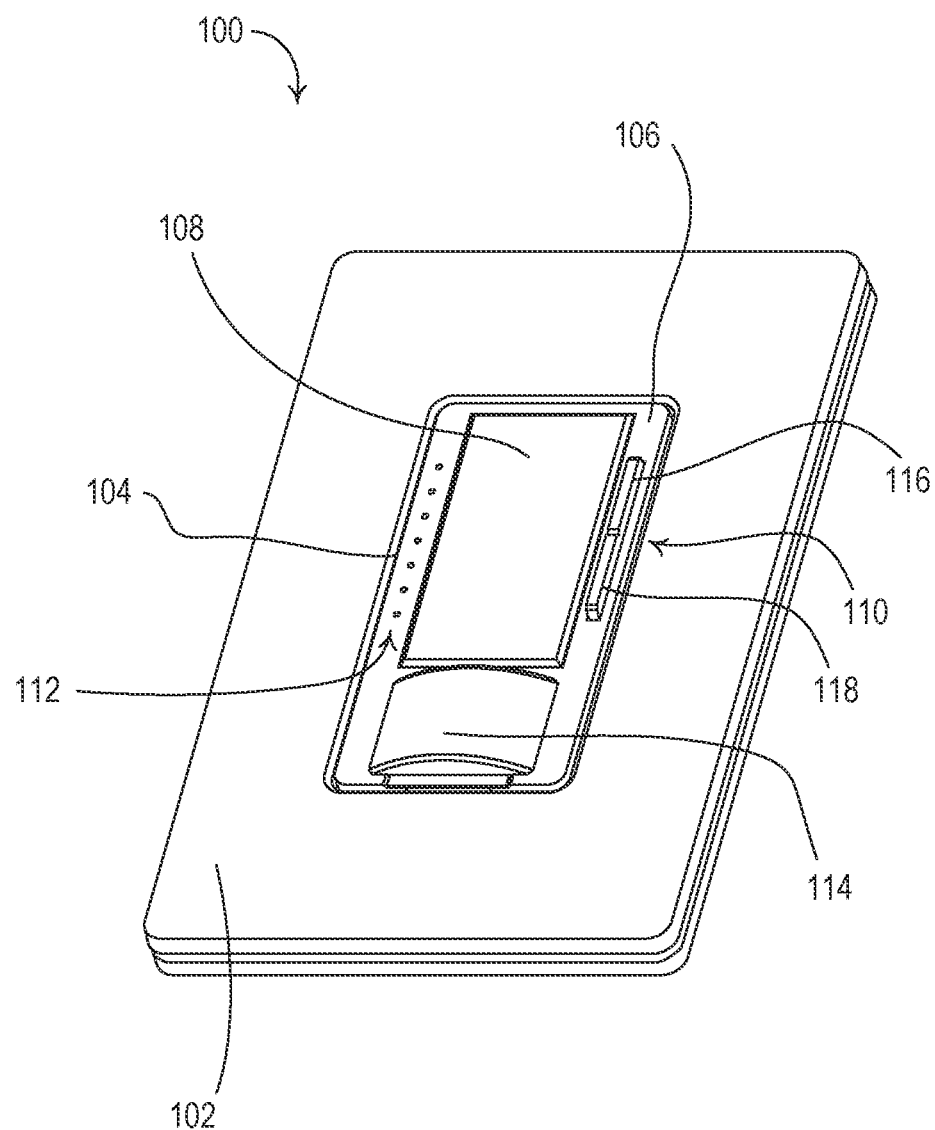
FIG. 1 is a perspective view of an example wall-mountable load control device.

FIG. 1 is a perspective view of an example wall-mountable load control device 100. In an example, the wall mountable load control device 100 may comprise a sensor dimmer switch. The load control device 100 may be adapted to be mounted in a single-gang electrical wallbox (not shown). The load control device 100 may comprise a plurality of electrical connections (e.g., screw terminals or wires) adapted to be coupled to an alternating-current (AC) power source (not shown) and an electrical load, for example, a lighting load (not shown). The load control device 100 may be adapted to be coupled in series electrical connection between the AC power source and the load for controlling the power delivered to the load.

The load control device 100 may comprise a yoke (not shown) for mounting the load control device 100 to the electrical wallbox. The load control device 100 may comprise a faceplate 102 that is mechanically coupled to the yoke and has an opening 104 through which a bezel 106 of the load control device 100 may be received. The load control device 100 may further comprise a toggle actuator 108 (e.g., a control button) and an intensity adjustment actuator 110 (e.g., a rocker switch) arranged on the bezel 106. Successive actuations of the toggle actuator 108 may toggle, e.g., turn off and on, the lighting load. Actuations of an upper portion 116 or a lower portion 118 of the intensity adjustment actuator 110 may respectively increase or decrease the amount of power delivered to the lighting load and thus increase or decrease the intensity of the lighting load from a minimum intensity (e.g., approximately 1%) to a maximum intensity (e.g., approximately 100%).

The load control device 100 may further comprise a lens 114 arranged on the bezel 106. The load control device 100 may comprise an internal detector. The load control device 100 may be configured to detect occupancy and vacancy conditions in the space around (e.g., in the vicinity of) the load control device 100 using, for example, the internal detector. The internal detector may comprise a pyroelectric detector, which is operable to receive infrared energy from an occupant in the space via the lens 114 to thus sense the occupancy and/or vacancy condition in the space. The internal detector may also comprise an ultrasonic detector, a microwave detector, or any combination of pyroelectric detectors, ultrasonic detectors, and/or microwave detectors. The load control device 100 may be configured to turn on the electrical load in response to detecting an occupancy condition in the space and to turn off the electrical load in response to detecting a vacancy condition in the space. An example of a load control device configured to control an electrical load in response to detecting occupancy and vacancy conditions is described in greater detail in commonly-assigned U.S. Pat. No. 9,084,310, issued Jul. 14, 2015, entitled METHOD AND APPARATUS FOR ADJUSTING AN AMBIENT LIGHT THRESHOLD, the entire disclosure of which is hereby incorporated by reference.

The load control device 100 may further comprise a plurality of visual indicators 112, e.g., light-emitting diodes (LEDs), which may be arranged in a linear array on the bezel 106. The visual indicators 112 may be illuminated to provide feedback of the intensity of the lighting load. The load control device may further comprise an LED (not shown) positioned to illuminate the lens 114 to provide feedback to the user (e.g., during a programming mode and/or when the load control device detects an occupancy and/or vacancy condition).

Figure 2:
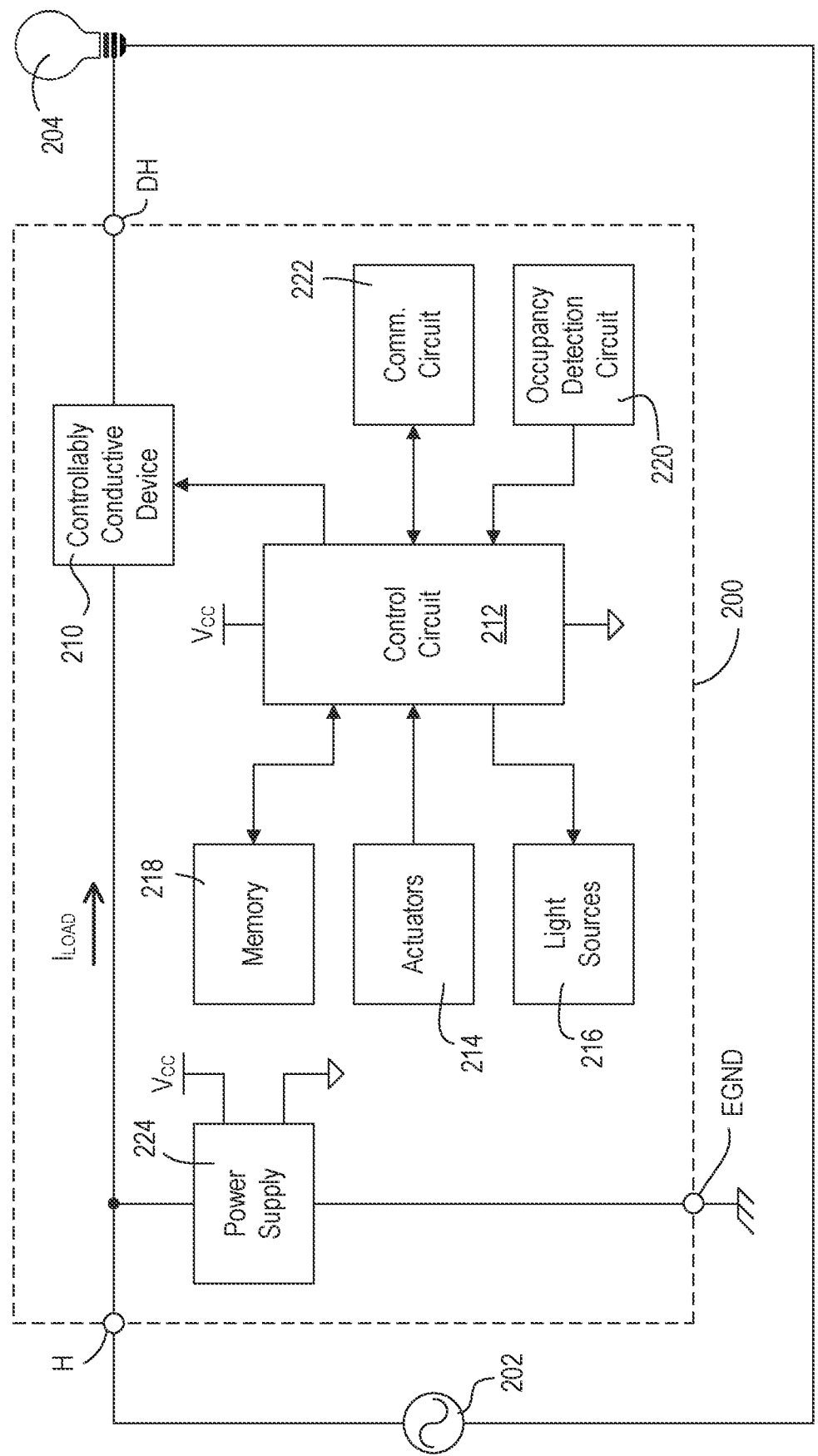
FIG. 2 is a simplified block diagram of an example load control device.

FIG. 2 is a simplified block diagram of an example of a load control device 200, which may be deployed as, for example, the wall-mountable load control device 100 shown in FIG. 1. The load control device 200 may comprise a hot terminal H adapted to be coupled to an AC power source 202 and a dimmed hot terminal DH adapted to be coupled to an electrical load, such as a lighting load 204. The load control device 200 may comprise a controllably conductive device 210 coupled in series electrical connection the hot terminal H and the dimmed-hot terminal DH (e.g., between the AC power source and the lighting load). The controllably conductive device 210 may comprise, for example, a thyristor (e.g., a triac), a field-effect transistor (FET) in a full-wave rectifier bridge, two FETs in anti-series connection, one or more insulated-gate bipolar junction transistors (IGBTs), or any suitable bidirectional semiconductor switch. The controllably conductive device 210 may conduct a load current $I_{LOAD}$ through the lighting load 204, and be controlled to control an amount of power delivered to the lighting load and thus an intensity level of the lighting load. Alternatively or additionally, the controllably conductive device 210 may comprise a relay and/or other suitable switching circuit configured to simply turn the lighting load 204 on and off.

The load control device 200 may include a control circuit 212 for controlling the operation of the load control device 200. The control circuit 212 may include one or more of a processor (e.g., a microprocessor), a microcontroller, a programmable logic device (PLD), a field programmable gate array (FPGA), an application specific integrated circuit (ASIC), or any suitable controller or processing device. The control circuit 212 may be configured to control the controllably conductive device 210 using a phase-control dimming technique (e.g., a forward phase-control dimming technique or a reverse phase-control diming technique), such that a phase-control signal (e.g., a phase-cut voltage) is generated at the dimmed-hot terminal DH. The dimmer control circuit 212 may be configured to control the controllably conductive device 210 to control the magnitude of the load current $I_{LOAD}$ conducted through the lighting load so as to adjust the intensity level of the lighting load across a dimming range between a low-end intensity level $L_{LE}$ and a high-end intensity level $L_{HE}$.

The control circuit 212 may be configured to receive inputs from one or more actuators 214 (e.g., the toggle actuator 108 and/or the intensity adjustment actuator 110 of the load control device 100 shown in FIG. 1). The control circuit 212 may be configured to render the controllably conductive device 210 conductive and non-conductive to turn the lighting load 204 on and off in response to actuations of the actuators 214. The control circuit 212 may be configured to turn the lighting load on and off, and adjust the intensity of the lighting load between the low-end intensity level $L_{LE}$ and the high-end intensity level $L_{HE}$ in response to actuations of the actuators 214.

The load control device 200 may further comprise one or more light sources 216 (e.g., LEDs). The light sources 216 may be configured to illuminate visual indicators of the load control device 200 (e.g., the visual indicators 112 of the load control device 100). The control circuit 212 may be control the light sources 216 to illuminate the visual indicators to provide feedback to a user. In addition, one of the light sources 216 may be positioned to illuminate a lens of the load control device 200 (e.g., the lens 114 of the load control device 100).

The control circuit 212 may also be coupled to a memory 218. The memory 218 may be communicatively coupled to the control circuit 212 for the storage and/or retrieval of, for example, operational settings, such as, lighting presets and associated preset light intensities. In addition, the memory 218 may be configured to store software for execution by the control circuit 212 to operate the load control device 200. The memory 218 may be implemented as an external integrated circuit (IC) or as an internal circuit of the control circuit 212.

The load control device 200 may further comprise a sensor circuit, such as an occupancy detection circuit 220 configured to detect an occupancy and/or vacancy condition in the vicinity of the load control device 200. The occupancy detection circuit 220 may comprise a detector for detecting an occupancy and/or vacancy condition in the space. For example, the occupancy detection circuit 220 may comprise a passive infrared (PIR) sensing circuit, where the detector is a pyroelectric detector. In addition, the detector may comprise one or more of an ultrasonic detector, and/or a microwave detector. For example, a pyroelectric detector may be configured to receive infrared energy from an occupant in the space around the load control device 200 through a lens (e.g., the lens 114 shown in FIG. 1) to thus sense the occupancy condition in the space. The control circuit 212 may be configured to determine a vacancy condition in the space after a timeout period expires since the last occupancy condition was detected. The control circuit 212 may be configured to turn the lighting load 204 on and off and to adjust the intensity of the lighting load 204 in response to the occupancy detection circuit 220 detecting occupancy and/or vacancy conditions.

The load control device 200 may comprise a communication circuit 222, e.g., a wired and/or wireless communication circuit, for transmitting and/or receiving wireless signals. For example, the communication circuit 222 may comprise a radio-frequency (RF) transceiver, an RF receiver, an RF transmitter, an infrared (IR) receiver, and/or other suitable wireless communication circuit. The load control device 200 may be configured to receive messages (e.g., digital messages) from an input device, for example, a remote occupancy and/or vacancy sensor, a networked device (e.g., a mobile device), a remote control device, and/or the like. The control circuit 212 may be configured to control the lighting load 204 in response to the messages received from the input device. For example, the control circuit 212 may be configured to control the lighting load 204 in response to the messages received from the remote occupancy and/or vacancy sensor in a similar manner as the control circuit operates in response to the internal occupancy detection circuit 220. In addition, the control circuit 212 may be configured to transmit a message indicating an occupancy and/or vacancy condition in response to the occupancy detection circuit 220. The communication circuit 222 may comprise a wired communication circuit configured to transmit and receive messages (e.g., digital messages) over a wired communication link, such as, for example, a serial communication link, an Ethernet communication link, a power-line carrier communication link, and/or other suitable digital communication link.

The load control device 200 may comprise a power supply 224 for generating a direct-current (DC) supply voltage $V_{CC}$ for powering the control circuit 212, the memory 218, the occupancy detection circuit 220, the communication circuit 222, and/or other low-voltage circuitry of the load control device 200. The power supply 224 may be coupled between the hot terminal H and an earth ground terminal EGND that may be coupled to an earth ground connection in the electrical wallbox in which the load control device 200 is mounted. The load control device 200 may (e.g., alternatively) comprise a neutral connection (not shown) adapted to be coupled to the neutral side of the AC power source 202, and the power supply 224 may be coupled between the hot terminal H and the neutral terminal. The load control device 200 may comprise a "two-wire" device that does not require an electrical connection to earth ground or neutral, and has one or more power supplies adapted to conduct a charging current through the lighting load 204.

Figure 3:
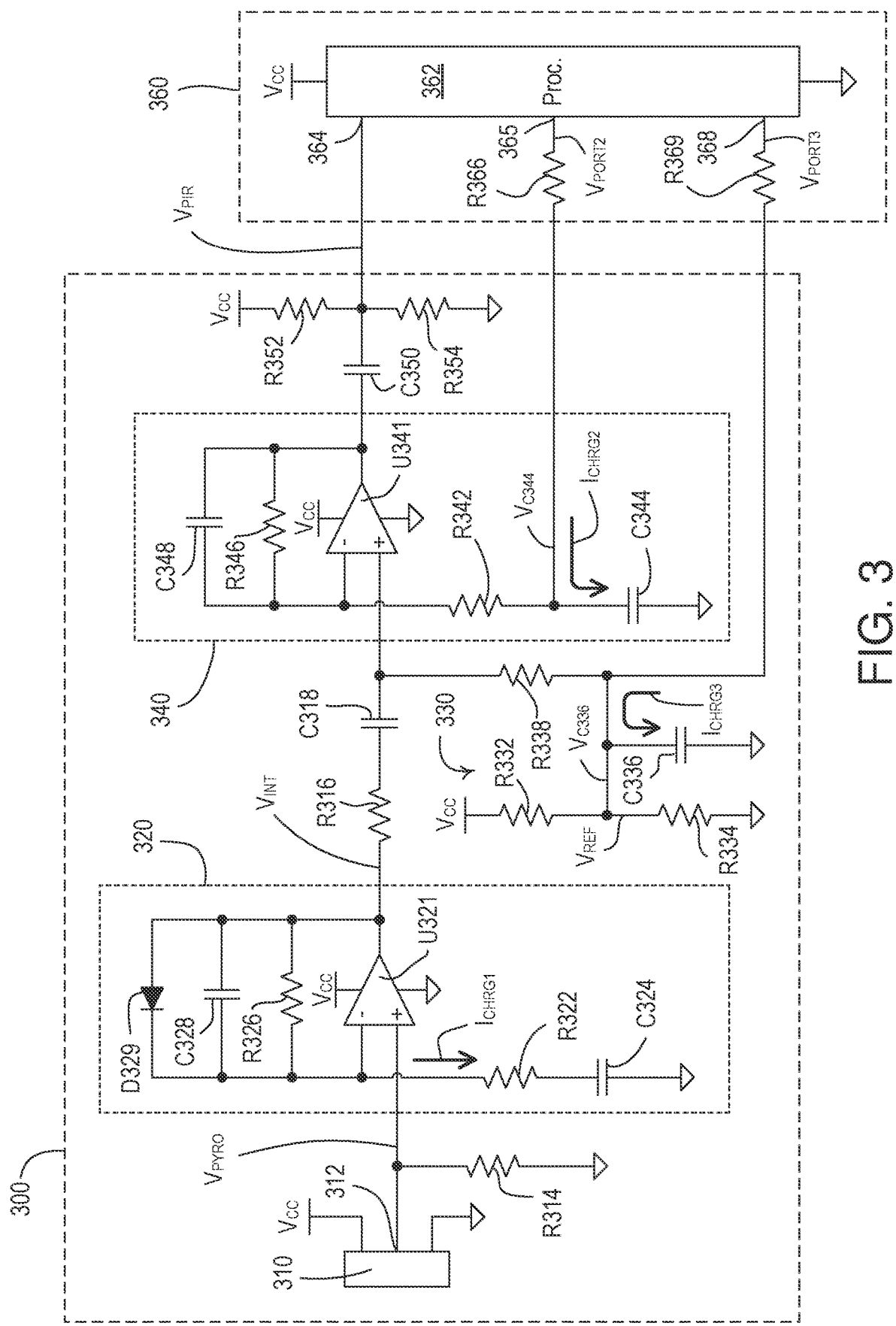
FIG. 3 is a simplified schematic diagram of an example passive infrared sensing circuit for use in a load control device, such as the load control device shown in FIG. 2.

FIG. 3 is a schematic diagram of an example passive infrared (PIR) sensing circuit 300 (e.g., the occupancy detection circuit 220 shown in FIG. 2) for use in a load control device (e.g., such as the load control device 100 show in FIG. 1 and/or the load control device 200 shown in FIG. 2). The passive infrared sensing circuit 300 may generate a PIR sensing signal $V_{PIR}$, which may be received by a control circuit 360 (e.g., the control circuit 212 shown in FIG. 2) for allowing the control circuit 360 to detect an occupancy and/or vacancy condition in a space around the load control device.

The passive infrared sensing circuit 300 may comprise a pyroelectric detector 310 configured to receive infrared energy from one or more occupants in the space around the load control device. For example, the pyroelectric detector 310 may be configured to receive the infrared energy from the occupants in the space through a lens (e.g., the lens 114 shown in FIG. 1) to allow for sensing of the occupancy and/or vacancy condition in the space. The pyroelectric detector 310 may be coupled between a supply voltage $V_{CC}$ (e.g., the DC supply voltage $V_{CC}$ as generated by or derived from the power supply 224) and a circuit common for receiving power from the supply voltage $V_{CC}$. For example, the supply voltage $V_{CC}$ may have a magnitude of approximately 3.3 V. The pyroelectric detector 310 may generate an output signal $V_{PYRO}$ at an output 312 in response to changes in the infrared energy received through the lens. The output 312 of the pyroelectric detector 310 may be pulled down towards circuit common through a resistor R314 (e.g., having a resistance of approximately 1 MΩ). The output signal $V_{PYRO}$ of the pyroelectric detector 310 may be an AC signal with a DC offset (e.g., DC bias other than zero). The pyroelectric detector 310 may comprise two pyroelectric elements (e.g., coupled in anti-series connection). When infrared energy is received by a first one of the pyroelectric elements, the pyroelectric detector 310 may generate a positive peak in the output signal $V_{PYRO}$, and, when infrared energy is received by a second one of the pyroelectric elements, the pyroelectric detector 310 may generate a negative peak in the output signal $V_{PYRO}$. During an operational state of the passive infrared sensing circuit 300, the magnitude (e.g., the peak magnitude) of the output signal $V_{PYRO}$ of the pyroelectric detector 310 may be relatively small (e.g., as compared to the magnitude of the supply voltage $V_{CC}$). For example, the output signal $V_{PYRO}$ of the pyroelectric detector 310 may have a peak-to-peak magnitude of approximately 2.2 μV and a DC offset that is dependent upon the pyroelectric detector 310 as well as the magnitude of the supply voltage $V_{CC}$ (e.g., approximately 0.2-1.5 V).

The passive infrared sensing circuit 300 may comprise two amplifier circuits, for example, a first amplifier circuit 320 and a second amplifier circuit 340. For example, each of the first and second amplifier circuits 320, 340 may be a high-gain, small-signal amplifier circuit. In addition, each of the first and second amplifier circuits 320, 340 may also operate as a bandpass filter. For example, each of the first and second amplifier circuits 320, 340 may be configured as an inverting bandpass filter circuit. The first and second amplifier circuits 320, 340 may be configured to amplify and filter the output signal $V_{PYRO}$ of the pyroelectric detector 310 to generate the PIR sensing signal $V_{PIR}$. Since the first and second amplifier circuits 320, 340 are both inverting circuits, the PIR sensing signal $V_{PIR}$ may be a non-inverted, amplified, and filtered version of the output signal $V_{PYRO}$ of the pyroelectric detector 310.

The first amplifier circuit 320 may comprise an operational amplifier U321 having a non-inverting input coupled to receive the output signal $V_{PYRO}$ from the pyroelectric detector 310. The first amplifier circuit 320 may comprise a first filter circuit including the series combination of a resistor R322 (e.g., having a resistance of approximately 14.3 kΩ) and a capacitor C324 (e.g., having a capacitance of approximately 100 μF). The series combination of the resistor R322 and the capacitor C324 may be coupled between an inverting input of the operational amplifier U321 and circuit common. During the operational state of the passive infrared sensing circuit 300, a voltage having a magnitude approximately equal to the DC offset of the output signal $V_{PYRO}$ of the pyroelectric detector 310 may be developed across the series combination of the resistor R322 and the capacitor C324. The first amplifier circuit 320 may comprise a second filter circuit including the parallel combination of a resistor R326 (e.g., having a resistance greater than approximately 1 MΩ, such as approximately 1.43 MΩ) and a capacitor C328 (e.g., having a capacitance of approximately 10 nF). The parallel combination of the resistor R326 and the capacitor C328 may be coupled between the inverting input and the output of the operational amplifier U321. The first amplifier circuit 320 may also comprise a diode D329 coupled in parallel with the parallel combination of the resistor R326 and the capacitor C328 (e.g., between the output and the inverting input of the operational amplifier U321). The diode D329 may have an anode coupled to the output of the operational amplifier U321 and a cathode coupled to the inverting input of the operational amplifier U321. The operational amplifier U321 may be powered from the supply voltage $V_{CC}$.

The first filter circuit of the first amplifier circuit 320 may be a resistor-capacitor (RC) circuit configured to operate as a low-pass filter. The second filter circuit of the first amplifier circuit 320 may be an RC circuit configured to operate as a high-pass filter. Together, the first and second filter circuits may cause the first amplifier circuit 320 to operate as a bandpass filter. The first amplifier circuit 320 may be characterized by a high gain, for example, greater than approximately +/−50. For example, the gain of the first amplifier circuit 320 may be approximately −100 (e.g., or 100 for a non-inverting amplifier circuit). During the operational state of the passive infrared sensing circuit 300, the magnitude of the voltage developed between the inverting input and the output of the operational amplifier U321 (e.g., across the parallel combination of the resistor R326 and the capacitor C328) may be relatively small (e.g., as compared to a rated forward voltage of the diode D329). Thus, the diode D329 may not be conductive during the operational state.

The first amplifier circuit 320 may generate an intermediate amplified voltage $V_{INT}$ at the output of the operational amplifier U321. The first amplifier circuit 320 (e.g., the output of the operational amplifier U321) may be coupled to the second amplifier circuit 340 via the series combination of a resistor R316 (e.g., having a resistance of approximately 100 kΩ) and a capacitor C318 (e.g., having a capacitance of approximately 1 μF). The passive infrared sensing circuit 300 may also comprise a reference voltage circuit 330 configured to generate a reference voltage $V_{REF}$ (e.g., having a magnitude of approximately 1.65 V). The reference voltage circuit 330 may comprise a resistive divider circuit including resistors R332, R334 (e.g., each having a resistance of approximately 2 MΩ). The resistive divider circuit may be coupled between the supply voltage $V_{CC}$ and circuit common, such that a reference voltage $V_{REF}$ (e.g., having a magnitude of approximately 1.65 V) may be produced at the junction of the resistors R332, R334. The reference voltage circuit 330 may comprise a capacitor C336 (e.g., having a capacitance of approximately 100 $\mu F_{[PSI]}$) that may be coupled between a junction of the resistors R332, R334 and circuit common, such that the reference voltage $V_{REF}$ is developed across the capacitor C336. The reference voltage circuit 330 may comprise another type of circuits, such as a power supply, configured to generate the reference voltage $V_{REF}$ across the capacitor C336.

The second amplifier circuit 340 may comprise an operational amplifier U341 having a non-inverting input coupled to receive the intermediate amplified voltage $V_{INT}$ via the resistor R316 and the capacitor C318. The non-inverting input of the operational amplifier U341 may also be coupled to the reference voltage $V_{REF}$ via a resistor R338 (e.g., having a resistance of approximately 2 MΩ) of the voltage reference circuit 330, such that the voltage at the non-inverting input may be biased around the reference voltage $V_{REF}$ (e.g., the voltage at the non-inverting input is an AC signal having a DC offset approximately equal to the reference voltage $V_{REF}$). The second amplifier circuit 340 may comprise a third filter circuit including the series combination of a resistor R342 (e.g., having a resistance of approximately 14.3 kΩ) and a capacitor C344 (e.g., having a capacitance of approximately 100 g). The series combination of the resistor R342 and the capacitor C344 may be coupled between the inverting input of the operational amplifier U341 and circuit common. During the operational state of the passive infrared sensing circuit 300, a voltage having a magnitude approximately equal to the reference voltage $V_{REF}$ may be developed across the series combination of the resistor R342 and the capacitor C344. The second amplifier circuit 340 may comprise a fourth filter circuit including the parallel combination of a resistor R346 (e.g., having a resistance of approximately 1.43 MΩ) and a capacitor C348 (e.g., having a capacitance of approximately 10 nF). The parallel combination of the resistor R346 and the capacitor C348 may be coupled between the inverting input and the output of the operational amplifier U341. The operational amplifier U341 may be powered from the supply voltage $V_{CC}$.

The third filter circuit of the second amplifier circuit 340 may be an RC circuit configured to operate as a low-pass filter. The fourth filter circuit of the second amplifier circuit 340 may be an RC circuit configured to operate as a high-pass filter. Together, the third and fourth filter circuits may cause the second amplifier circuit 340 to operate as a bandpass filter. During the operational state of the passive infrared sensing circuit 300, the magnitude of the voltage developed between the inverting input and the output of the operational amplifier U341 (e.g., across the parallel combination of the resistor R346 and the capacitor C348) may be relatively small (e.g., as compared to the magnitude of the supply voltage $V_{CC}$). The second amplifier circuit 340 may be characterized by a high gain, for example, greater than approximately +/−50. For example, the gain of the second amplifier circuit 340 may be approximately −100 (e.g., or 100 for a non-inverting amplifier circuit).

The control circuit 360 may comprise a processor 362, which may be, for example, a processor (e.g., a microprocessor), a microcontroller, a programmable logic device (PLD), a field programmable gate array (FPGA), an application specific integrated circuit (ASIC), or any suitable controller or processing device. The processor 362 may be configured to receive the PIR sensing signal $V_{PIR}$ at a first port 364. For example, the processor 360 may comprise an analog-to-digital converter (ADC) for sampling a magnitude of the PIR sensing signal $V_{PIR}$ at the first port 364. In addition, the control circuit 360 may comprise an analog-to-digital converter (ADC) integrated circuit external to the processor 362 for sampling the magnitude of the PIR sensing signal $V_{PIR}$. The second amplifier circuit 340 (e.g., the output of the operational amplifier U341) may be coupled to the first port 364 of the processor 362 via a capacitor C350 (e.g., having a capacitance of approximately 1 µF). The first port 364 of the processor 362 may also be coupled to the supply voltage $V_{CC}$ via a resistor R352 (e.g., having a resistance of approximately 2 MΩ) and to circuit common via a resistor R354 (e.g., having a resistance of approximately 2 MΩ), such that the PIR sensing signal $V_{PIR}$ is biased around a bias voltage $V_{BIAS}$ (e.g., approximately 1.65 V) at the first port 364 of the processor 362.

One of more of the capacitors of the passive infrared sensing circuit 300 may need to be charged to appropriate levels prior to operation of the passive infrared sensing circuit 300 during the operational state such that the PIR sensing signal $V_{PIR}$ appropriately indicates the occupancy and/or vacancy conditions. Prior to operation in the operational state, the control circuit may be configured to operate in a charging state during which the control circuit may charge one or more capacitors of the passive infrared sensing circuit 300 through the control circuit 360 (e.g., through the processor 362). For example, the control circuit 360 may be configured to charge the capacitor C344 of the second amplifier circuit C344 through the control circuit 360 (e.g., through the processor 362) and measure the magnitude of a capacitor voltage $V_{C344}$ developed across the capacitor C344 to determine when to stop charging the capacitor C344. In addition, the control circuit 360 may be configured to charge the capacitor C336 of the reference voltage circuit 330 through the control circuit 360 (e.g., through the processor 362) and measure the magnitude of a capacitor voltage $V_{C336}$ developed across the capacitor C336 to determine when to stop charging the capacitor C336.

The processor 362 may comprise a second port 365 coupled to the junction of the resistor R342 and the capacitor C344 of the second amplifier circuit 340 via a resistor R366 (e.g., having a resistance of approximately 100 kΩ). The processor 362 may configure the second port 365 as an input or an output. For example, the processor 360 may comprise an analog-to-digital converter (ADC) for sampling a magnitude of a second-port voltage $V_{PORT2}$ at the second port 365 when the second port is configured as an input (e.g., an analog input of an analog-to-digital converter). In addition, the control circuit 360 may comprise an analog-to-digital converter (ADC) integrated circuit external to the processor 362 for sampling the magnitude of the second-port voltage $V_{PORT2}$. When the second port 365 is configured as an output, the processor 362 may be configured to drive the magnitude of the second-port voltage $V_{PORT2}$ at the second port 365 high towards the supply voltage $V_{CC}$ for charging the capacitor C344 through the resistor R366 (e.g., as will be described in greater detail below). When the second port 365 is configured as an input (e.g., an analog input), the processor 362 may be configured to sample the magnitude of the second-port voltage $V_{PORT2}$ to determine the magnitude of the capacitor voltage $V_{C344}$ developed across the capacitor C344 (e.g., using an internal or external analog-to-digital converter). While the processor 362 is shown having a single second port 365 in FIG. 3, the processor 362 could alternatively have separate ports for charging the capacitor C344 and determining the magnitude of the capacitor voltage $V_{C344}$ developed across the capacitor C344.

The processor 362 may comprise a third port 368 coupled to the junction of the resistors R332, R334 of the reference voltage circuit 330 via a resistor R369 (e.g., having a resistance of approximately 100 kΩ). The processor 362 may configure the third port 368 as an input or an output. For example, the processor 360 may use the analog-to-digital converter to sample a magnitude of a third-port voltage $V_{PORT3}$ at the third port 368 when the third port is configured as an input (e.g., an analog input of an analog-to-digital converter). In addition, the control circuit 360 may comprise an analog-to-digital converter (ADC) integrated circuit external to the processor 362 for sampling the magnitude of the third-port voltage $V_{PORT3}$. When the third port 368 is configured as an output, the processor 362 may be configured to drive the magnitude of the third-port voltage $V_{PORT3}$ at the third port 368 high towards the supply voltage $V_{CC}$ for charging the capacitor C336 of the reference voltage circuit 330 through the resistor R369 (e.g., as will be described in greater detail below). When the third port 368 is configured as an input (e.g., an analog input), the processor 362 may be configured to sample the magnitude of the third-port voltage $V_{PORT3}$ to determine the magnitude of the capacitor voltage $V_{C336}$ developed across the capacitor C336 (e.g., using an internal or external analog-to-digital converter). While the processor 362 is shown having a single third port 368 in FIG. 3, the processor 362 could alternatively have separate ports for charging the capacitor C336 and determining the magnitude of the capacitor voltage $V_{C336}$ developed across the capacitor C336.

When the passive infrared sensing circuit 300 is first powered up, the passive infrared sensing circuit 300 may begin by operating in the charging state during which the capacitor C324 of the first amplifier circuit 320, the capacitor C344 of the second amplifier circuit 340, and the capacitor C336 of the reference voltage circuit 330 may charge to appropriate magnitudes for proper operation during the operational state. During the charging state, the control circuit 360 may not be able to detect an occupancy and/or vacancy condition in response to the passive infrared sensing circuit 300. Once the capacitors C324, C344, C336 charge to the appropriate magnitudes, the passive infrared sensing circuit 300 may operate in the operational state to generate the PIR sensing signal $V_{PIR}$ to indicate the occupancy and/or vacancy conditions.

During the charging state, the capacitor C344 in the second amplifier circuit 340 may be configured to charge, for example, until a voltage across the series combination of the resistor R342 and the capacitor C344 (e.g., the third filter circuit) of the second amplifier circuit 340 is approximately equal to the magnitude of the reference voltage $V_{REF}$. The processor 362 of the control circuit 360 may configure the second port 365 as an output and drive the magnitude of the second-port voltage $V_{PORT2}$ high towards the supply voltage $V_{CC}$ to charge the capacitor C344 through the resistor R366 by conducting a charging current $I_{CHRG2}$ through the second port 365 of the processor 360. While charging the capacitor C344, the processor 362 may be configured to periodically configure the second port 365 as an input and sample the magnitude of the second-port voltage $V_{PORT2}$ to determine the magnitude of the capacitor voltage $V_{C344}$ developed across the capacitor C344. The control circuit 360 may be configured to charge the capacitor C344 via the second port 365 until the magnitude of the capacitor voltage $V_{C344}$ developed across the capacitor C344 is approximately equal to a predetermined magnitude, which may be approximately equal to the magnitude of the reference voltage $V_{REF}$ (e.g., approximately 1.65 V).

During the charging state, the capacitor C336 may be configured to charge, for example, until a voltage across the capacitor C336 is approximately equal to the magnitude of the reference voltage $V_{REF}$. The processor 362 of the control circuit 360 may configure the third port 368 as an output and drive the magnitude of the third-port voltage $V_{PORT3}$ high towards the supply voltage $V_{CC}$ to charge the capacitor C336 through the resistor R368 by conducting a charging current $I_{CHRG3}$ through the third port 368 of the processor 360. While charging the capacitor C336, the processor 362 may be configured to periodically configure the third port 368 as an input and sample the magnitude of the third-port voltage $V_{PORT3}$ to determine the magnitude of the capacitor voltage $V_{C336}$ developed across the capacitor C336. The control circuit 360 may be configured to charge the capacitor C336 via the third port 368 until the magnitude of the capacitor voltage $V_{C336}$ developed across the capacitor C336 is approximately equal to a predetermined magnitude, which may be approximately equal to the magnitude of the reference voltage $V_{REF}$ (e.g., approximately 1.65 V). The control circuit 360 may be configured to charge the capacitor C344 of the second amplifier circuit 340 and the capacitor C336 of the reference voltage circuit 330 simultaneously, such that the magnitudes of the voltages across the capacitor C344 and the capacitor C336 increase at the same rate.

The capacitor C324 in the first amplifier circuit 320 may be configured to charge until a voltage developed across the series combination of the resistor R322 and the capacitor C324 (e.g., the first filter circuit) of the first amplifier circuit 320 is approximately equal to the DC offset of the output signal $V_{PYRO}$ of the pyroelectric detector 310. Since the DC offset of the offset of the output signal $V_{PYRO}$ of the pyroelectric detector 310 is dependent upon the pyroelectric detector 310 as well as the magnitude of the supply voltage $V_{CC}$, the control circuit 360 may not know the specific magnitude to which to charge the capacitor C324 of the first amplifier circuit 320, and may not be able to charge the capacitor C324 in the same manner as the capacitor C344 of the second amplifier circuit 340 and the capacitor C336 of the reference voltage circuit 330 are charged. In addition, it may undesirable to couple the capacitor C324 to the control circuit 360 to allow for charging of the capacitor C324 from the control circuit 360 since noise could be coupled to the inverting input of the first operational amplifier U321 of the first amplifier circuit 320, which may be susceptible to noise at the inverting input being amplified in the intermediate amplified voltage $V_{INT}$. As shown in FIG. 3, the capacitor C324 of the first amplifier circuit 320 may be configured to charge by conducting a charging current $I_{CHRG1}$ through the parallel combination of the resistor R326, the capacitor C328, and the diode D329.

When the passive infrared circuit 300 is first powered up (e.g., at the beginning of the charging state), the operational amplifier U321 of the first amplifier circuit 320 may drive the magnitude of the intermediate amplified voltage $V_{INT}$ at the output of the operational amplifier U321 high towards the supply voltage $V_{CC}$, thus allowing the capacitor C324 to conduct the charging current $I_{CHRG1}$ through the parallel combination of the resistor R326, the capacitor C328, and the diode D329. During the charging state, the magnitude of the voltage developed between the output and the inverting input of the operational amplifier U321 may be relatively large (e.g., as compared to the voltage during the operational state). For example, during the charging state, the magnitude of the voltage developed between the output and the inverting input of the operational amplifier U321 may exceed the rated forward voltage of the diode D329, such that the diode D329 may conduct a majority of the charging current $I_{CHRG1}$ of the capacitor C324. The passive infrared sensing circuit 300 may operate in a state of relatively-high voltage during the charging state, and in a state of relatively-low voltage during the operational state.

Without the diode D329 in the first amplifier circuit 320, the capacitor C324 would have to conduct the majority of the charging current $I_{CHRG1}$ through the resistor R326. Since the resistor R326 has a large resistance (e.g., approximately 1 MΩ or more), the time required to charge the capacitor C324 may be relatively long, for example, approximately 180 seconds. This may lead to a long and undesirable delay (e.g., more than two minutes) for the passive infrared receiving circuit 300 to become functional (e.g., and thus the load control device in which the passive infrared receiving circuit 300 is located to become functional). With the diode D329 in the first amplifier circuit 320, the diode D329 may conduct the majority of the charging current $I_{CHRG1}$, thereby bypassing the resistor R326 during the charging state, which may allow the time required to charge the capacitor C324 to decrease, for example, to approximately 18 seconds (e.g., approximately ten times smaller). Since the magnitude of the voltage developed between the inverting input and the output of the operational amplifier U321 (e.g., across the parallel combination of the resistor R326 and the capacitor C328) are relatively small during the operational state (e.g., relative small as compared to the magnitude of the rated forward voltage of the diode D329), the diode D329 may not be conductive during the operational state.

Figure 4:
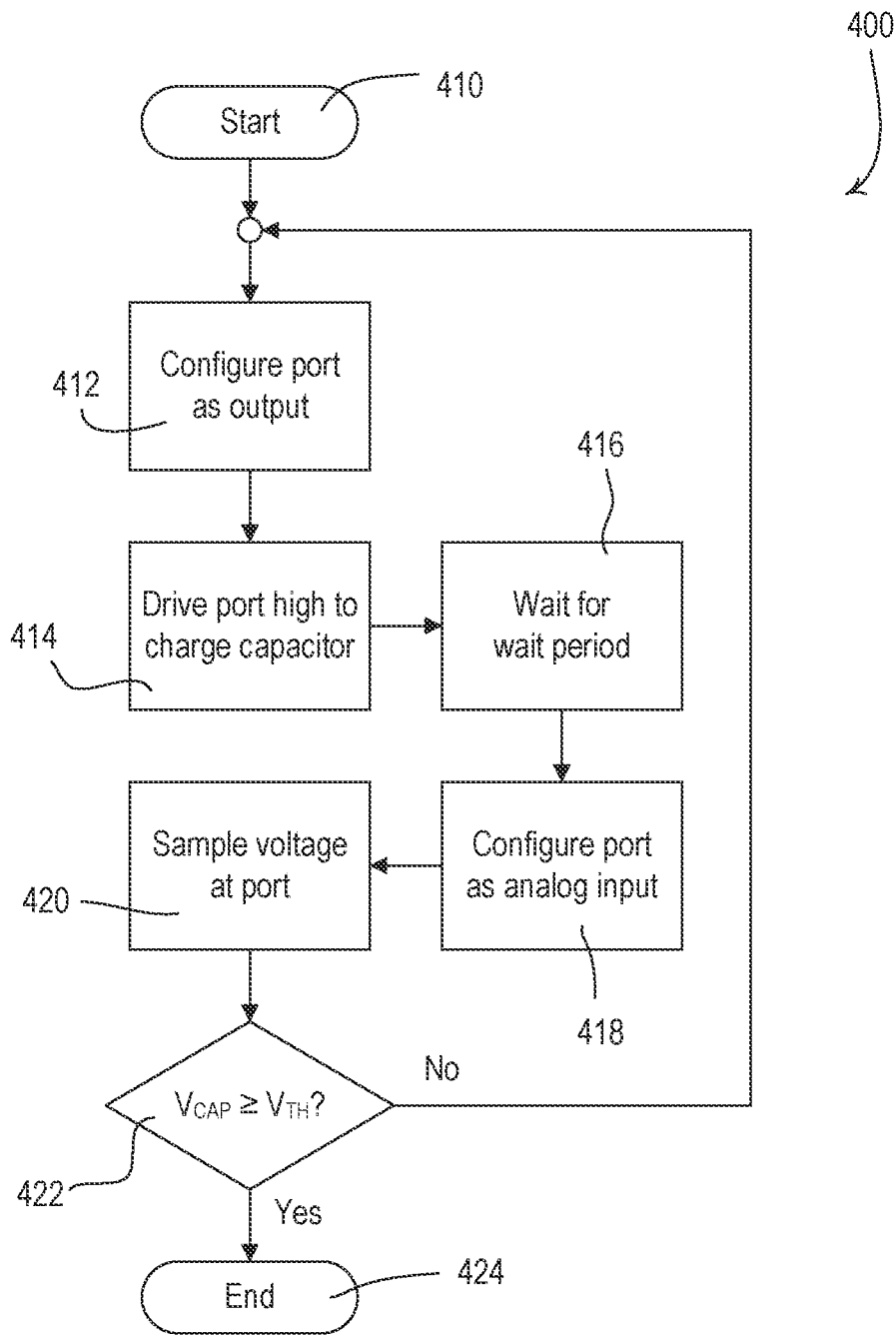
FIG. 4 is a flowchart of an example charging procedure for charging a capacitor of a load control device.

FIG. 4 is a flowchart of an example charging procedure 400 for charging one or more capacitors of a load control device (e.g., such as the load control device 100 show in FIG. 1 and/or the load control device 200 shown in FIG. 2). For example, the capacitors may be a part of a passive infrared sensing circuit (e.g., the occupancy detection circuit 220 shown in FIG. 2 and/or the passive infrared sensing circuit 300 shown in FIG. 3). In addition, one of the capacitors (e.g., the capacitor C344) may be coupled to an input of an amplifier circuit (e.g., the inverting input of the operational amplifier U341 of the second amplifier circuit 340 shown in FIG. 3). Another one of the capacitors (e.g., the capacitor C336) may be coupled to the junction of two resistors of a resistor divider circuit that may generate a reference voltage (e.g., the resistors R332, R334 that generate the reference voltage $V_{REF}$. Each of the capacitors may need to be charged to a threshold voltage (e.g., approximately equal to the reference voltage $V_{REF}$) before the passive infrared sensing circuit can become functional. The charging procedure 400 may be executed by a control circuit of the load control device (e.g., the control circuit 212 and/or the processor 362 of the control circuit 360). For example, the control circuit may execute the charging procedure 400 as part of a startup procedure to charge the capacitor up before the passive infrared sensing circuit becomes functional. The capacitors may each be coupled to a port (e.g., the second and third ports 365, 368) via a resistor (e.g., the resistors R366, R369) for charging the capacitors through the control circuit 360. The flowchart of the charging procedure 400 shown in FIG. 4 is described with reference to charging a single capacitor. However, the charging procedure 400 may be executed multiple times to charge multiple capacitors of a load control device. For example, the control circuit may execute the charging procedure multiple times simultaneously, such that the capacitors charge at the same time and the magnitudes of the voltages across the capacitors increase at the same rate.

The charging procedure 400 may start at 410. At 412, the control circuit may configure the port as an output. For example, when charging two capacitors at the same time (e.g., the capacitors C336, C344), the control circuit may configure two ports (e.g., the second and third ports 365, 368) as outputs at substantially the same time. At 414, the control circuit may drive the port high (e.g., towards the supply voltage $V_{CC}$) to charge the capacitor. For example, when charging two capacitors at the same time, the control circuit may drive both ports (e.g., the second and third ports 365, 368) high towards the supply voltage $V_{CC}$ at substantially the same time. At 416, the control circuit may wait for a wait period (e.g., approximately 500 milliseconds), before configuring the port as an input (e.g., an analog input) at 418 and sampling a voltage at the port (e.g., using an analog-to-digital converter of the control circuit) at 420. The magnitude of the voltage at the port may indicate, for example, the magnitude of a capacitor voltage $V_{CAP}$ (e.g., the capacitor voltages $V_{C336}$, $V_{C344}$) developed across the capacitor being charged through the control circuit. For example, when charging two capacitors at the same time, the control circuit may configure the ports as analog input at substantially the same time, sample a voltage at a first one of the ports (e.g., the second-port voltage $V_{PORT2}$ at the second port 365), and then sample a voltage at the second one of the ports (e.g., the third-port voltage $V_{PORT3}$ at the third port 368).

At 422, the control circuit may determine if the magnitude of the capacitor voltage $V_{CAP}$ is greater than or equal to a threshold voltage $V_{TH}$. For example, the threshold voltage $V_{TH}$ may be approximately equal to the magnitude of the reference voltage $V_{REF}$ (e.g., approximately 1.65 V). If the magnitude of the capacitor voltage $V_{CAP}$ is not greater than or equal to the threshold voltage $V_{TH}$ at 422, the charging procedure may loop around to 412 and the control circuit may drive the port high to charge the capacitor again at 414 and sample the magnitude of the voltage at the port again at 420. When the magnitude of the capacitor voltage $V_{CAP}$ is greater than or equal to the threshold voltage $V_{TH}$ at 422, the control circuit may stop charging the capacitor and the charging procedure 400 may simply exit at 424. For example, when charging two capacitors at the same time, the control circuit may determine if the magnitude of the capacitor voltage at the first one of the ports (e.g., the capacitor voltage $V_{C344}$) is greater than a first threshold $V_{TH1}$, and continue to charge the first capacitor if the magnitude of the capacitor voltage at the first one of the ports is not greater than or equal to the first threshold $V_{TH1}$. The control circuit may also determine if the magnitude of the capacitor voltage at the second one of the ports (e.g., the capacitor voltage $V_{C336}$) is greater than a second threshold $V_{TH2}$, and continue to charge the second capacitor if the magnitude of the capacitor voltage at the second one of the ports is not greater than or equal to the second threshold $V_{TH2}$. For example, the first and second threshold voltages $V_{TH1}$, $V_{TH2}$ may be equal to each other (e.g., approximately equal to the magnitude of the reference voltage $V_{REF}$) when the control circuit is charging both of the capacitors up to approximately the reference voltage $V_{REF}$. The control circuit may stop charging the first capacitor when the magnitude of the capacitor voltage at the first one of the ports is greater than or equal to the first threshold $V_{TH1}$ and may stop charging the second capacitor when the magnitude of the capacitor voltage at the second one of the ports is greater than or equal to the second threshold $V_{TH2}$.

Figure 5:
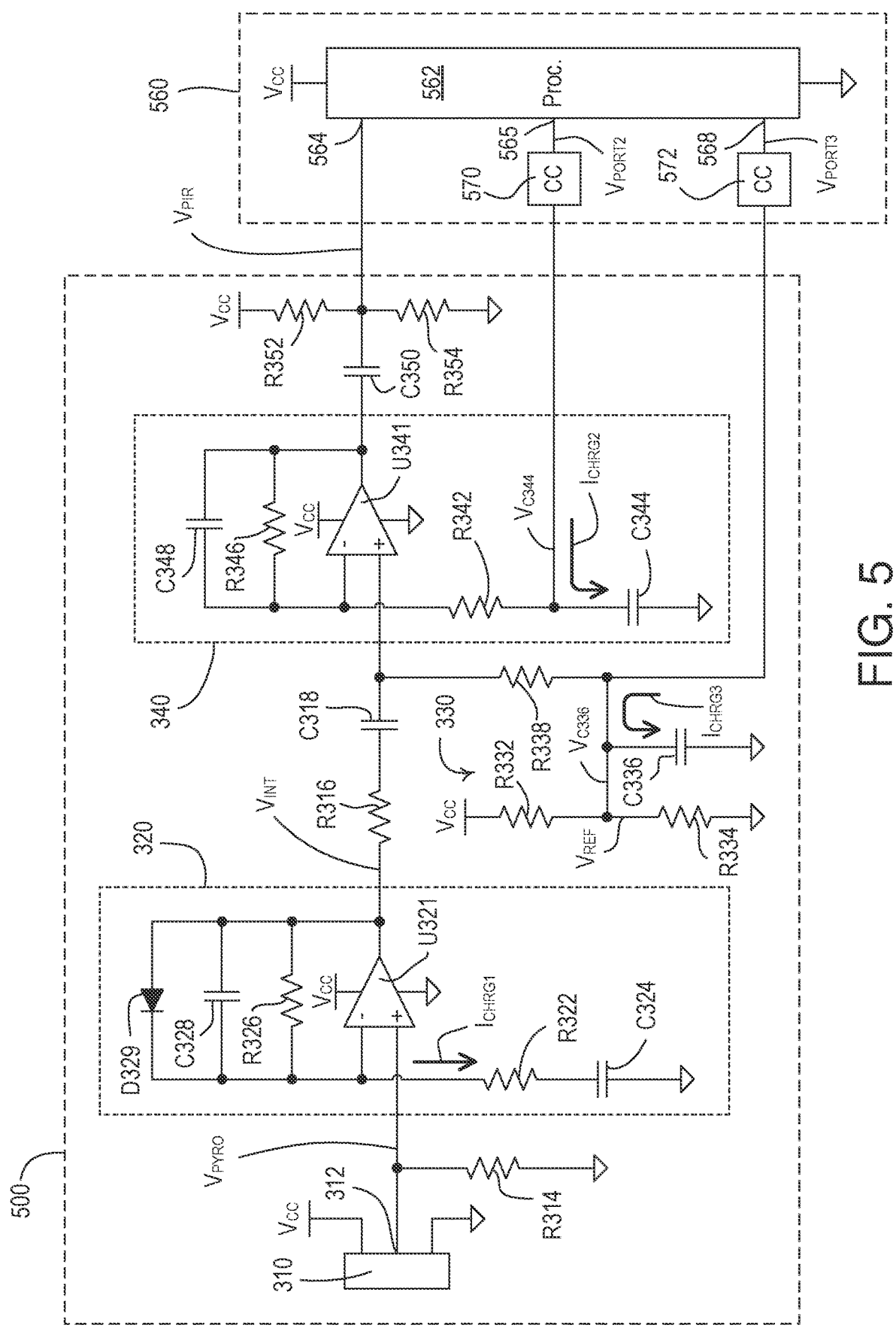
FIG. 5 is a simplified schematic diagram of an example passive infrared sensing circuit for use in a load control device, such as the load control device shown in FIG. 2.

FIG. 5 is a schematic diagram of an example passive infrared (PIR) sensing circuit 500 (e.g., the occupancy detection circuit 220 shown in FIG. 2) for use in a load control device (e.g., such as the load control device 100 show in FIG. 1 and/or the load control device 200 shown in FIG. 2). The passive infrared sensing circuit 500 may be identical to the passive infrared sensing circuit 300 shown in FIG. 3. The passive infrared sensing circuit 500 may generate a PIR sensing signal $V_{PIR}$, which may be received by a control circuit 560 (e.g., the control circuit 212 shown in FIG. 2) for allowing the control circuit 560 to detect an occupancy and/or vacancy condition in a space around the load control device.

The control circuit 560 may comprise a processor 562, which may be, for example, a processor (e.g., a microprocessor), a microcontroller, a programmable logic device (PLD), a field programmable gate array (FPGA), an application specific integrated circuit (ASIC), or any suitable digital controller or digital processing device. The processor 562 may be configured to receive the PIR sensing signal $V_{PIR}$ at a first port 564. For example, the processor 560 may comprise an analog-to-digital converter (ADC) for sampling a magnitude of the PIR sensing signal $V_{PIR}$ at the first port 564. In addition, the control circuit 560 may comprise an ADC integrated circuit external to the processor 562. The second amplifier circuit 340 (e.g., the output of the operational amplifier U341) may be coupled to the first port 564 of the processor 562 via the capacitor C350. The first port 564 of the processor 562 may also be coupled to the supply voltage $V_{CC}$ via the resistor R352 and to circuit common via the resistor R354, such that the PIR sensing signal $V_{PIR}$ is biased around the bias voltage $V_{BIAS}$ (e.g., approximately 1.65 V) at the first port 564 of the processor 562.

The control circuit 560 may comprise a first charging circuit 570 configured to charge the capacitor C344 of the second amplifier circuit 340 through the processor 562 and determine the magnitude of the capacitor voltage $V_{CAP}$ developed across the capacitor C344 to determine when to stop charging the capacitor C344. The first charging circuit 570 may be coupled between a second port 565 of the processor 562 and the junction of the resistor R342 and the capacitor C344 of the second amplifier circuit 340. The processor 562 may configure the second port 565 as an output and may drive the magnitude of a second-port voltage $V_{PORT2}$ at the second port 565 high towards the supply voltage $V_{CC}$ in order to the capacitor C344 through the first charging circuit 570 by conducting a charging current $I_{CHRG2}$ through the second port 565 of the processor 560. The first charging circuit 570 may be configured to control the magnitude of the charging current $I_{CHRG2}$ to be substantially constant (e.g., approximately 100 μA).

The control circuit 560 may comprise a second charging circuit 572 configured to charge the capacitor C336 of the of the reference voltage circuit 330 through the processor 562 and measure the magnitude of the capacitor voltage $V_{C336}$ developed across the capacitor C336 to determine when to stop charging the capacitor C336. The second charging circuit 572 may be coupled between a third port 568 of the processor 562 and the junction of the resistors R332, R334 of the reference voltage circuit 330. The processor 562 may configure the third port 568 as an output and may drive the magnitude of a third-port voltage $V_{PORT3}$ at the third port 568 high towards the supply voltage $V_{CC}$ in order to the capacitor C336 through the second charging circuit 572 by conducting a charging current $I_{CHRG3}$ through the third port 568 of the processor 560. The second charging circuit 572 may be configured to control the magnitude of the charging current $I_{CHRG3}$ to be substantially constant (e.g., approximately 100 µA). For example, the second charging circuit 572 may be very similar (e.g., identical) to the first charging circuit 570.

When the passive infrared sensing circuit 500 is first powered up, the passive infrared sensing circuit 500 may begin by operating in the charging state during which the capacitor C324 of the first amplifier circuit 320, the capacitor C344 of the second amplifier circuit 340, and the capacitor C336 of the reference voltage circuit 330 may charge to appropriate magnitudes for proper operation during the operational state. During the charging state, the control circuit 560 may not be able to detect an occupancy and/or vacancy condition in response to the passive infrared sensing circuit 500. Once the capacitors C324, C344, C336 charge to the appropriate magnitudes, the passive infrared sensing circuit 500 may operate in the operational state to generate the PIR sensing signal $V_{PIR}$ to indicate the occupancy and/or vacancy conditions. The capacitor C324 of the first amplifier circuit 320 may charge through the diode D329 in the same manner as described above for the passive infrared sensing circuit 300.

To charge the capacitor C344 of the second amplifier circuit 340 during the charging state, the processor 562 of the control circuit 560 may drive (e.g., continuously drive) the magnitude of the second-port voltage $V_{PORT2}$ high towards the supply voltage $V_{CC}$ to charge the capacitor C344 through the first charging circuit 570. The capacitor C344 in the second amplifier circuit 340 may be configured to charge, for example, until a voltage across the series combination of the resistor R342 and the capacitor C344 (e.g., the third filter circuit) of the second amplifier circuit 340 is approximately equal to the magnitude of the reference voltage $V_{REF}$. The charging circuit 570 may monitor the magnitude of the capacitor voltage $V_{C344}$ developed across the capacitor C344 while the capacitor C344 is charging and stop charging the capacitor C344 by ceasing to conduct the charging current $I_{CHRG2}$ through the capacitor C344 when the magnitude of the capacitor voltage $V_{C344}$ exceed a threshold voltage. For example, the threshold voltage may be approximately equal to the magnitude of the reference voltage $V_{REF}$ (e.g., approximately 1.65 V).

To charge the capacitor C336 of the reference voltage circuit 330 during the charging state, the processor 562 of the control circuit 560 may drive (e.g., continuously drive) the magnitude of the third-port voltage $V_{PORT3}$ high towards the supply voltage $V_{CC}$ to charge the capacitor C336 through the second charging circuit 572. The capacitor C336 in the reference voltage circuit 336 may be configured to charge, for example, until a voltage across the capacitor C336 of the reference voltage circuit 330 is approximately equal to the magnitude of the reference voltage $V_{REF}$ The second charging circuit 572 may monitor the magnitude of the capacitor voltage $V_{C36}$ developed across the capacitor C336 while the capacitor C336 is charging and stop charging the capacitor C336 by ceasing to conduct the charging current $I_{CHRG3}$ through the capacitor C336 when the magnitude of the capacitor voltage $V_{C336}$ exceed a threshold voltage. For example, the threshold voltage may be approximately equal to the magnitude of the reference voltage $V_{REF}$ (e.g., approximately 1.65 V).

Figure 6:
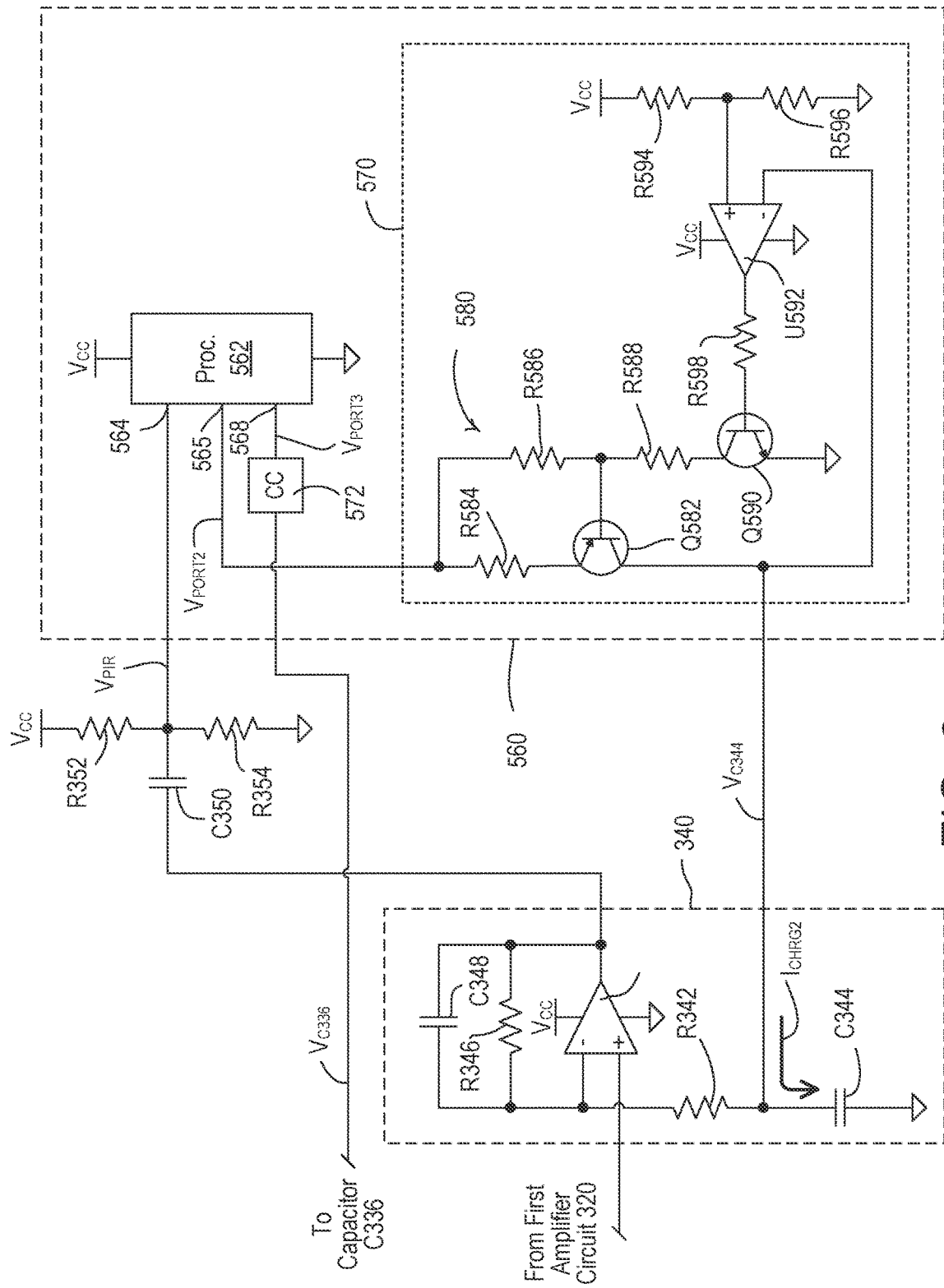
FIG. 6 is a schematic diagram of a portion of the passive infrared sensing circuit and the control circuit of FIG. 5.

FIG. 6 is a schematic diagram of a portion of the passive infrared sensing circuit 500 and the control circuit 560 of FIG. 5 showing the first charging circuit 570 in greater detail. The first charging circuit 570 may comprise a current source circuit 580 including a PNP bipolar junction transistor Q552 and resistors R584, R586, R588. The emitter of the transistor Q582 may be coupled to the second port 565 of the processor 562 via the resistor R584 (e.g., which may have a resistance of approximately 10 kΩ). The collector of the transistor Q582 may be coupled to the junction of the junction of the resistor R342 and the capacitor C344 of the second amplifier circuit 340, such that the current source circuit 580 of the charging circuit 570 may conduct the charging current $I_{CHRG2}$ through the processor 562 and the capacitor C344. The resistors R586, R588 may be coupled in series with the collector-emitter junction of a NPN bipolar junction transistor Q590 between the second port 565 of the processor 562 and circuit common. The junction of the resistors R586, R588 may be coupled to the base of the transistor Q582 and may each have a resistor of, for example, approximately 10 kΩ). When the transistor Q590 is conductive (e.g., operating in the saturated region), the magnitude of a voltage at the junction of the resistors R586, R588 (e.g., at the base of the transistor Q582) may be equal to approximately half of the supply voltage $V_{CC}$ (e.g., approximately 1.65 V). In addition, the magnitude of the voltage developed across the series combination of the resistor R584 and the emitter-base junction of the transistor Q582 may also be held constant at approximately half of the supply voltage $V_{CC}$, such that the magnitude of the charging current conducted through the emitter-collector junction of the transistor Q582 may also be held constant (e.g., at approximately 100 µA) while the transistor Q590 is conductive.

The charging circuit 570 may comprise a comparator U592 for causing the current source circuit 580 to stop conducting the charging current $I_{CHRG2}$ when the magnitude of the capacitor voltage $V_{CAP}$ developed across the capacitor C344 of the second amplifier circuit 340 exceeds a threshold voltage $V_{TH}$ The charging circuit may also comprise a resistive divider circuit including resistors R594, R596 (e.g., each having a resistance of approximately 2 MΩ) coupled in series between the supply voltage $V_{CC}$ and circuit common, such that a voltage having a magnitude equal to approximately half of the supply voltage $V_{CC}$ (e.g., approximately 1.65 V) is generated at the junction of the resistors R594, R596. The positive input of the comparator U592 may be coupled to the junction of the resistors R594, R596, such that the threshold voltage $V_{TH}$ has a magnitude of approximately 1.65 V. The negative input of the comparator U592 may receive the capacitor voltage $V_{CAP}$. The output of the comparator U592 may be coupled to the base of the transistor Q590 through a resistor R598 (e.g., having a resistance of approximately 10 kΩ).

When the magnitude of the capacitor voltage $V_{CAP}$ is less than the threshold voltage $V_{TH}$ (e.g., when the capacitor C344 is uncharged at or near the beginning of the charging state), the comparator U592 may drive the magnitude of the voltage at the output high towards the supply voltage $V_{CC}$, such that the transistor Q590 is rendered conductive and the current source circuit 580 conducts the charging current $I_{CHRG2}$ through the second port 565 of the processor 562 and the capacitor C344 of the second amplifier circuit 340. When the magnitude of the capacitor voltage $V_{CAP}$ exceeds the threshold voltage $V_{TH}$, the comparator U592 may drive the magnitude of the voltage at the output low towards circuit common, such that the transistor Q590 is render non-conductive. As a result, the voltage across the resistor R586 (e.g., and the series combination of the resistor R584 and the base-emitter junction of the transistor Q582) may drop to approximately zero volts, such that the transistor R582 is rendered non-conductive and the current source circuit 580 ceases to conduct the charging current $I_{CHRG2}$ through the capacitor C344 of the second amplifier circuit 340. While not shown in FIG. 6, the second charging circuit 572 may have a similar (e.g., same) structure as the first charging circuit 570 and may be configured to conduct the charging current $I_{CHRG3}$ through the third port 568 of the processor 562 and the capacitor C336 of the reference voltage circuit 330.

What is claimed is:

1. A control device comprising:
a passive infrared sensing circuit comprising:
    a pyroelectric detector configured to receive infrared energy and generate an output signal in response to the received infrared energy;
    a first amplifier circuit configured to amplify the output signal of the pyroelectric detector to generate an amplified signal; and
    a second amplifier circuit comprising an operational amplifier having an inverting input, a non-inverting input, and an output, the non-inverting input coupled to receive the amplified signal, the second amplifier circuit further comprising a series combination of a first resistor and a first capacitor coupled between the inverting input of the operational amplifier and the circuit common, and a parallel combination of a second resistor and a second capacitor coupled between the inverting input and the output of the operational amplifier; and
a control circuit coupled to receive a passive infrared sensing signal from the second amplifier circuit of the passive infrared sensing circuit, the control circuit further coupled to the junction of the first resistor and the first capacitor;
wherein, prior to the passive infrared sensing circuit entering an operational state, the control circuit is configured to charge the first capacitor of the second amplifier circuit by conducting a first charging current through the control circuit and the first capacitor, and stop charging the first capacitor when the magnitude of a voltage developed across the first capacitor is greater than or equal to a threshold voltage.

2. The control device of claim 1, wherein the control circuit comprises a processor having a first port configured to be driven high for charging the first capacitor and conducting the first charging current through the processor.

3. The control device of claim 2, wherein the passive infrared sensing circuit further comprises a reference voltage circuit configured to generate a reference voltage, the reference voltage circuit having a third capacitor across which the reference voltage is developed, the voltage reference circuit configured to couple the reference voltage to the amplified signal at the non-inverting input of the operational amplifier of the second amplifier circuit, such that the amplified signal has a direct-current offset equal to approximately the reference voltage.

4. The control device of claim 3, wherein the reference voltage circuit comprises a resistive divider circuit having a third resistor and a fourth resistor coupled in series between a supply voltage and circuit common for generating the reference voltage at the junction of the third and fourth resistors.

5. The control device of claim 4, wherein the processor of the control circuit comprises a second port coupled to the junction of the third and fourth resistors via a fifth resistor, the processor configured to charge the third capacitor by driving a voltage at the second port high towards the supply voltage and conducting a second charging current through the processor and the fifth resistor.

6. The control device of claim 5, wherein the processor is configured to periodically configure the second port as an input, sample the voltage at the second port, and configure the second port as an output prior to driving the voltage at the second port high to charge the third capacitor.

7. The control device of claim 6, wherein the processor is configured to stop charging the third capacitor when the magnitude of the sampled voltage is greater than or equal to a threshold voltage, and wherein the threshold voltage is approximately equal to the magnitude of the reference voltage generated by the resistive divider circuit.

8. The control device of claim 4, wherein the processor of the control circuit comprises a second port coupled to the junction of the third and fourth resistors via a charging circuit, the processor configured to charge the third capacitor by driving a voltage at the second port high towards the supply voltage and conducting a second charging current through the charging circuit.

9. The control device of claim 8, wherein the charging circuit comprises a comparator configured to control the current source to stop charging the first capacitor when the magnitude of a capacitor voltage developed across the first capacitor exceeds a threshold voltage, and wherein the threshold voltage is approximately equal to the magnitude of the reference voltage generated by the reference voltage circuit.

10. The control device of claim 3, wherein the processor is configured to simultaneously charge the first capacitor and the third capacitor so that the magnitudes of the voltages across the first and third capacitors increase at approximately the same rate.

11. The control device of claim 2, wherein the first port of the processor is coupled to the junction of the first resistor and the first capacitor via a third resistor, the processor configured to charge the first capacitor by driving a voltage at the first port high towards a supply voltage and conducting the first charging current through the third resistor.

12. The control device of claim 11, wherein the processor is configured to periodically configure the first port as an input, sample the voltage at the first port, and configure the first port as an output prior to driving the voltage at the first port high to charge the first capacitor.

13. The control device of claim 12, wherein the processor is configured to stop charging the first capacitor when the magnitude of the sampled voltage is greater than or equal to a threshold voltage.

14. The control device of claim 13, wherein the first amplifier circuit is configured to generate the amplified signal as an alternating-current signal having a direct-current offset during the operational state of the passive infrared sensing circuit, and wherein the threshold voltage is approximately equal to the direct-current offset of the amplified signal.

15. The control device of claim 12, wherein the processor comprises an analog-to-digital converter for sampling the voltage at the first port, the processor configured to configure the first port as an analog input prior to sampling the voltage at the first port.

16. The control device of claim 11, wherein the processor is configured to configure the first port as an output prior to driving the voltage at the first port high to charge the first capacitor.

17. The control device of claim 2, wherein the first port of the processor is coupled to the junction of the first resistor and the first capacitor via a charging circuit, the processor configured to charge the capacitor by driving a voltage at the first port high towards a supply voltage and conducting the first charging current through the charging circuit.

18. The control device of claim 17, wherein the charging circuit comprises a comparator configured to control the current source to stop charging the first capacitor when the magnitude of a capacitor voltage developed across the first capacitor exceeds a threshold voltage.

19. The control device of claim 18, wherein the first amplifier circuit is configured to generate the amplified signal as an alternating-current signal having a direct-current offset during the operational state of the passive infrared sensing circuit, and wherein the threshold voltage is approximately equal to the direct-current offset of the amplified signal.

20. The control device of claim 17, wherein the charging circuit comprises a current source configured to conduct the first charging current and to control the magnitude of the first charging current to be constant.

21. The control device of claim 2, wherein the processor is configured to receive the passive infrared sensing signal from the second amplifier circuit of the passive infrared sensing circuit, the processor configured to detect an occupancy condition or a vacancy condition in response to the passive infrared sensing signal.

22. The control device of claim 21, further comprising:
a controllably conductive device adapted to be coupled between a power source and an electrical load for controlling an amount of power delivered to the electrical load;
wherein the processor is configured to control the controllably conductive device to adjust the amount of current delivered to the electrical load in response to detecting the occupancy condition or the vacancy condition via the passive infrared sensing circuit.

23. The control device of claim 21, further comprising:
a communication circuit configured to transmit messages;
wherein the processor is configured to cause the communication circuit to transmit a message indicating the occupancy condition or the vacancy condition in response to detecting the occupancy condition or the vacancy condition via the passive infrared sensing circuit.

* * * * *